United States Patent [19]

Tay et al.

[11] Patent Number: 5,296,258
[45] Date of Patent: Mar. 22, 1994

[54] METHOD OF FORMING SILICON CARBIDE

[75] Inventors: Sing P. Tay; Joseph P. Ellul, both of Nepean, Canada

[73] Assignee: Northern Telecom Limited, Montreal, Canada

[21] Appl. No.: 953,373

[22] Filed: Sep. 30, 1992

[51] Int. Cl.⁵ .............................................. C23C 16/00
[52] U.S. Cl. ......................................... 427/96; 427/99; 427/249; 427/255.2; 427/397.7
[58] Field of Search ............... 427/96, 99, 249, 255.2, 427/397.7

[56] References Cited

U.S. PATENT DOCUMENTS

| | | | |
|---|---|---|---|
| 4,426,405 | 1/1984 | Hierholzer | 427/249 |
| 4,810,526 | 3/1989 | Ito | 427/249 |
| 4,923,716 | 5/1990 | Brown et al. | 427/249 |
| 5,053,255 | 10/1991 | Boeglin | 427/249 |
| 5,061,514 | 10/1991 | Boeglin | 427/249 |

FOREIGN PATENT DOCUMENTS

| | | | |
|---|---|---|---|
| 2-217471 | 8/1990 | Japan | 427/249 |
| 9201083 | 1/1992 | PCT Int'l Appl. | 427/249 |

OTHER PUBLICATIONS

Tay, S. P., et al, Materials Research Society Meeting, Symposium G. Abstract G7.3, Boston, Dec. 1991.
T. Sugii, et al., Proceedings of First Topical Symposium on Silicon Based Heterostructures, edited by S. S. Iyer et al., Toronto, Canada, Oct. 90, p. 124.
"Refractive Index and Birefringence of 2 H Silicon Carbide", J. Anthony Powell, Journal of the Optical Society of America, vol. 62, No. 3, Mar. 1972.
"Refractive Index and Dispersion of Beta Silicon Carbide", Peter T. B. Shaffer, et al, The Carborundum Company, Niagara Falls, New York (Jul. 3, 1969).

Primary Examiner—Shrive Beck
Assistant Examiner—Vi Duang Dang
Attorney, Agent, or Firm—Angela de Wilton

[57] ABSTRACT

A low temperature CVD method is provided for depositing high quality stoichiometric, poly-crystalline silicon carbide films and for depositing emitter quality, heavily doped silicon carbide films, suitable for application in silicon hetero-junction bipolar transistors. The process is compatible with bipolar-CMOS device processing and comprises pyrolysis of di-tert-butyl silane in an oxygen free ambient, with n-type doping provided by phosphorus source comprising tert-butyl phosphine. Advantageously oxygen is excluded from the reactant gas mixture and the method includes pre-cleaning the susbtrate with nitrogen trifluoride and passivating the silicon carbide film with fluorine species from nitrogen trifluoride.

37 Claims, 2 Drawing Sheets

METHOD OF FORMING SILICON CARBIDE

FIELD OF THE INVENTION

This invention relates to a method of forming silicon carbide, with particular application for integrated circuits.

BACKGROUND OF THE INVENTION

Silicon carbide has recently attracted attention as a wide band gap emitter material for silicon heterojunction bipolar transistors. Si-HBTs. SiC emitters have been shown to block hole back injection in npn transistors allowing heavily doped base regions to be used, while maintaining reasonable current gain. This in turn permits a narrowing of the base region, improving high frequency performance.

Conventional known methods for formation of device quality single crystalline $\beta$-SiC require epitaxial growth by reaction of silanes and a hydrocarbon, typically acetylene or propane, at temperatures higher than 900° C., and typically 1400° C., for example as described in U.S. Pat. No. 4,923,716 to Brown et al. issued 8 May 1990, entitled "Chemical Vapour deposition of silicon carbide". Such high temperatures are undesirable in a bipolar CMOS (BiCMOS) process for forming wide band gap emitters in Si-HBTs, and in particular for high speed bipolar transistors which have a very thin (about 50 nm) highly doped base. To suppress dopant redistribution in the base and preserve ultra shallow base profiles during emitter formation, alternative low temperature processes for deposition of amorphous and polycrystalline $SiC_x$ deposition are required.

Polycrystalline silicon carbide emitters for HBTs have been formed at a deposition temperature as low as 900° C. as described by T. Sugii, T. Aoyama, Y. Furumura, and T. Ito, Proceedings of the First Topical Symposium on Silicon Based Heterostructures, edited by S. S. Iyer et al., Toronto, Canada, October 1990, pp. 124. Also, as described in the latter article and references therein, amorphous SiC emitters were fabricated by deposition at 700° C., but the material was heavily doped with fluorine to passivate dangling bonds. In the latter process, in which $SiC_x$ was deposited from a gaseous reactant mixture of disilane $Si_2H_6$ and acetylene $C_2H_2$ with phosphine $PH_3$, and difluorosilane $SiH_2F_2$ as a source of fluorine, acceptably low film resistivity could only be obtained if the atomic carbon fraction were 20% or less.

As described in U.S. Pat. No. 5,053,255 to Boeglin entitled "CVD process for the thermally depositing silicon carbide films onto a substrate" issued 1 Oct. 1991, silicon carbide may be deposited at low temperature by pyrolysis of di-tert-butylsilane (DTBS). DTBS is a less toxic, air stable, non corrosive liquid, and is thus preferred over silane and other gaseous sources of silicon for CVD (chemical vapour deposition) being less hazardous in use. However, the latter process was found to produce silicon carbide films with an appreciable oxygen content ~6%. An alternative method using Plasma CVD as described in U.S. Pat. No 5,061,514 to Boeglin entitled "CVD process for the plasma depositing silicon carbide films onto a substrate", issued 29 Oct. 1991 allows reaction to be carried out at a lower temperature, in the range from 100° C. to 400° C., but the resulting film was carbon rich and contained a substantial amount (12%) of oxygen. In forming Si-HBTs the presence of oxygen may create generation-recombination centres which may increase junction leakage.

Thus for application in Si-HBTs, a process with a reduced thermal budget (i.e. process temperature and time product) is required to form emitter quality $SiC_x$ with low resistivity, i.e., by incorporation of controlled amounts of impurities comprising, for example, phosphorus or boron, and fluorine, and reduction of other impurities which may be detrimental to electrical characteristics, e.g., oxygen.

SUMMARY OF THE INVENTION

The present invention seeks to provide a method of forming silicon carbide, for application in integrated circuits, in which the above mentioned problems are reduced or avoided.

According to one aspect of the present invention, there is provided a method of forming silicon carbide for an integrated circuit structure comprising: providing a substrate for an integrated circuit, exposing the substrate in a chemical vapour deposition chamber and purging the chamber to remove residual oxygen by flowing through the chamber an inert gas purified to remove oxygen, and then exposing the substrate to a gaseous reactant mixture comprising di-tert-butyl silane and said inert gas in the absence of gaseous oxygen and at a controlled flow rate, pressure and temperature, whereby a layer of silicon carbide is deposited on the substrate.

It was found that exclusion of residual oxygen in the reaction chamber was critical to formation of high quality silicon carbide films, necessary for application in integrated circuits for device quality, repeatability and integrity. Preferably argon purified by a point-of-use system was flowed through the reaction chamber before and during deposition of silicon carbide. The stoichiometry of the film was strongly temperature dependent and the deposition temperature, pressure and gas flow rates were controllable to provide stoichiometric, silicon rich or carbon rich films.

In situ precleaning of the substrate surface with nitrogen trifluoride, $NF_3$, was found to be advantageous in substrate preparation which includes removal of surface oxide and passivation of potential traps or states. Also, the presence of fluorine in silicon carbide was used to passivate dangling bonds in the amorphous material.

According to another aspect of the present invention there is provided a method of forming silicon carbide for an integrated circuit, comprising: providing a substrate for an integrated circuit; exposing the substrate within a reaction chamber to a mixture of reactant gases comprising di-tert-butyl silane at a flow rate of 250 to 350 sccm and tert-butyl phosphine (TBP) at a flow rate of 130 to 350 sccm in an inert carrier gas comprising argon at a flow rate from 200 to 1000 sccm, while maintaining the pressure in the range from 0.25 to 1 Torr and the temperature in the range from 550° C. to 800° C., whereby a layer of n doped silicon carbide is deposited on the substrate.

Doped silicon carbide films of low resistivity were formed by adding a reactant gas generated from a liquid source of an appropriate dopant species. For example to provide n+ $SiC_x$, the reactant gas mixture included an organo-phosphorus compound, i.e. tert-butyl phosphine.

Film deposition was preferably carried out at about 775° C. at which temperature stoichiometric SiC films were deposited. After deposition, annealing of the resulting silicon carbide film by a rapid thermal annealing, for example at 1000° C. for 10 seconds, in an inert atmosphere of nitrogen was found to provide polycrystalline n+ $SiC_x$ films of high quality and low resistivity.

According to a further aspect of the present invention, there is provided a method of providing a silicon carbide emitter structure for a silicon heterojuntion bipolar transistor comprising the steps of: providing a substrate for an integrated circuit comprising a surface dielectric layer having defined therein an emitter opening, the emitter opening defining an active device region of the substrate including a heavily doped base region; exposing the substrate within a reaction chamber; evacuating the chamber and flowing into the chamber an inert carrier gas comprising argon purified to remove oxygen, the reaction chamber thereby being purged to remove residual oxygen; and exposing the substrate to a mixture of reactant gases comprising di-tert-butyl silane at a flow rate of 250 to 350 sccm and tert-butyl phosphine at a flow rate of 130 to 350 sccm in said inert carrier gas comprising argon purified to remove oxygen, at a flow rate from 200 to 1000 sccm, while maintaining the pressure in the range from 0.25 to 1 Torr and the temperature in the range from 550° to 800° C., whereby a layer of n+ doped silicon carbide is deposited on the substrate, said layer of silicon carbide comprising less than 0.1 atomic percent oxygen, and subsequently annealing the silicon carbide layer in an inert atmosphere at a temperature greater than the deposition temperature and less than 1100° C. and for a time sufficient to form a crystalline phase of silicon carbide.

According to another aspect of the present invention, there is provided a method of forming silicon carbide for an emitter structure for a silicon heterojunction bipolar transistor comprising: providing a substrate for an integrated circuit comprising a surface dielectric layer having defined therein an emitter opening, the emitter opening defining an active device region of the substrate including a heavily doped base region, and after exposing the substrate within a reaction chamber, evacuating the chamber and flowing into the chamber an inert carrier gas comprising argon purified to remove oxygen, the reaction chamber thereby being purged to remove residual oxygen; precleaning and passivating the substrate by exposing the surface to a reactive fluorine species; and then providing a layer of silicon carbide on the substrate by steps comprising:

(a) after purging the chamber with said inert carrier gas, depositing a first thickness of doped silicon carbide on the substrate by exposing the surface of the substrate to a mixture of reactant gases comprising di-tert-butyl silane and tert-butyl phosphine in said inert carrier gas;

(b) purging the chamber with said inert carrier gas;

(c) then preparing the surface of the first thickness of deposited silicon carbide by exposing the surface to said reactive fluorine species;

(d) after purging the chamber with said inert carrier gas, depositing a second thickness of heavily doped silicon carbide by exposing the surface of the substrate to a mixture of reactant gases comprising di-tert-butyl silane and tert-butyl phosphine in said inert carrier gas; and then sequentially repeating steps (b), (c) and (d) until a layer of a desired thickness of silicon carbide has been deposited; and subsequently annealing the silicon carbide layer in an inert atmosphere at a temperature greater than the deposition temperature, and less than 1100° C. and for a time sufficient to form a crystalline phase of silicon carbide.

Thus fluorine may be incorporated into the layer of silicon carbide in a stepwise deposition process. In situ fluorine via $NF_3$ or other fluorine bearing gas/vapour incorporates fluorine into the silicon carbide film only, since there is substantially no diffusion for deposition at low temperature, i.e., less than ~850° C. and fluorine is therefore kept only where it is needed.

According to yet another aspect of the present invention there is provided a method of forming silicon carbide for an integrated circuit structure comprising:

exposing a surface of a substrate for an integrated circuit in a chemical vapour deposition chamber and purging the chamber to remove residual oxygen by flowing through the chamber an inert gas purified to remove oxygen; preparing the surface by exposure to a reactive fluorine species to preclean and passivate the exposed surface; exposing the prepared surface to a gaseous reactant mixture comprising an organo-silicon compound and source of a dopant species derived from volatile liquid phase source compounds, and said gaseous reactant mixture being introduced into the chamber at a controlled flow rate, pressure and temperature whereby a layer of a specific thickness of doped silicon carbide is deposited on the substrate.

According to a yet further aspect of the present invention there is provided a method of forming silicon carbide for an integrated circuit structure, comprising: exposing a surface of a substrate for an integrated circuit in a chemical vapour deposition chamber; purging the chamber with a purified inert carrier gas to remove residual oxygen from the chamber; pre-cleaning and preparing the surface by exposure to a reactive fluorine containing gas within the chamber; purging the chamber with said inert gas; providing a first thickness of a layer of doped silicon carbide by a method of chemical vapour deposition from a mixture of reactant gases comprising a source of silicon and a source of carbon, and a source of dopant species; purging the chamber of reactant gases; passivating the surface of said first thickness of the deposited layer of silicon carbide with fluorine species by exposure to said reactive fluorine containing gas; and, after purging the chamber with the inert gas, depositing a second thickness of a layer of doped silicon carbide by said method of chemical vapour deposition, whereby fluorine is incorporated into the deposited silicon carbide layer between said first and second thicknesses of silicon carbide.

Thus the present invention provides a method of forming silicon carbide, with particular application for integrated circuits, in which the above mentioned problems are reduced or avoided.

BRIEF DESCRIPTION OF THE DRAWINGS

Embodiments of the invention will now be described by way of example, with reference to the accompanying drawings, in which.

DESCRIPTION OF THE PREFERRED EMBODIMENT

Figure 1:
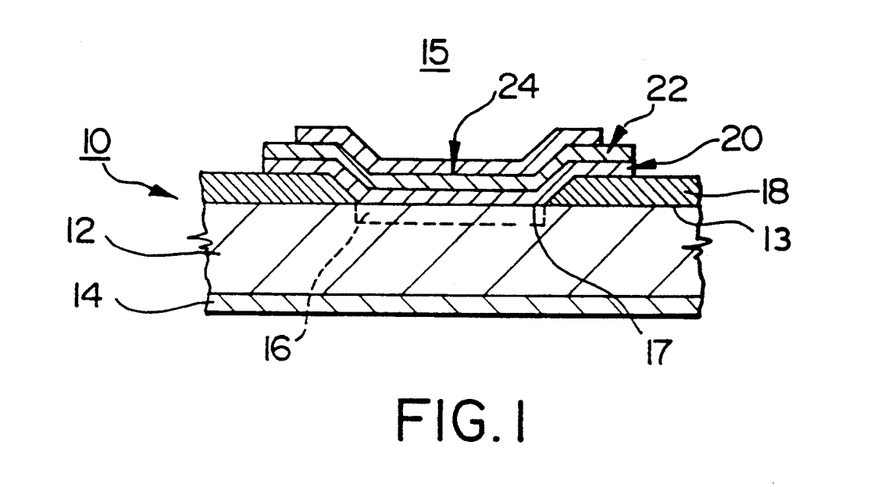
FIG. 1 shows a schematic of part of a integrated circuit structure comprising a silicon carbide emitter heterojunction diode formed by a method according to an embodiment of the present invention.

Silicon hetereojunction diodes were formed on a susbtrate for an integrated circuit, as shown schematically in FIG. 1, which includes part of an integrated circuit structure 10, having a silicon heterojunction diode 15 formed on a base region 16 comprising a layer of p-type silicon of (100) orientation, and typically 0.2 to 0.002 Ωcm resistivity, and having an emitter structure 20 formed from a layer of silicon carbide provided thereon by a method according to an embodiment of the present invention. In the method of forming a heterojunction diode 15, a substrate was provided comprising a semiconductor silicon wafer 12 of p-type silicon of 20 Ωcm resistivity. A 200 nm thermal passivation oxide layer 18, i.e. silicon dioxide, was grown on the surface 13 of the p-type silicon wafer 12 by a conventional known method and windows were opened in the oxide layer 18 to define an active device area 17 on the surface 13 of the p type silicon 12. The active area 17 was heavily doped by implantation with boron ions, with a typical implant doses from $10^{13}$ cm$^{-2}$ to $10^{16}$ cm$^{-2}$ at 25 keV, to form a base region 16 having a resistivity in the range 0.2 to 0.002 Ωcm. A 10% HF etch was used to remove native oxide from the active device area 17 immediately before placing the wafer in a conventional low pressure CVD chamber to deposit thereon a layer of silicon carbide 20 to form an emitter. The silicon substrate surface was pre-cleaned in situ, immediately prior to SiC deposition by exposure to nitrogen trifluoride ($NF_3$) in argon to remove residual native oxide and to clean and passivate the active device area 17 (see Example I). After purging the chamber with argon, a layer of heavily phosphorus doped silicon carbide 20 was then formed by low pressure CVD by exposing the substrate to a mixture of reactant gases from liquid source reagents comprising DTBS, with tert-butyl phosphine (TBP) as a phosphorus source in the presence of an inert carrier gas comprising argon. The mixture of reactant gases and the carrier gas flowed into the chamber at controlled flow rates, and at a pressure of about 0.35 Torr, as will be described in more detail below. The process temperature was maintained at 775° C. For example, under the conditions of Example I, a layer of 40 to 100 nm thickness of silicon carbide was provided to form an emitter structure, and the deposition rate was about 18 nm per minute. The silicon carbide layer was overlaid with a layer of 300 nm of polysilicon 22, heavily doped in situ with phosphorus to facilitate ohmic contact formation, using a conventional known method of CVD. For example n+ polysilicon was deposited by pyrolysis of silane and TBP at 600° C. and 0.35 Torr. The silicon carbide/polysilicon stack was patterned by planar plasma etching using $CF_4/O_2$ and the samples were rapid thermal annealed for 10 seconds at 1000° or 1100° C. Front contact metallization 24 was formed by a conventional process, and for example, comprised a TiW barrier layer on the polysilicon and an overlying layer of aluminium. A layer 14 of metal comprising aluminium was provided as a backside contact. The contacts were sintered in hydrogen at 450° C.

The process for deposition of silicon carbide was optimized using a hot wall LPCVD furnace for pyrolysis of DTBS in the pressure range of 0.25 to 1 Torr and in the temperature range from 550° to 800° C.

The vapour flow rate was controlled with MKS model 1150-A controllers. Liquid DTBS has a boiling point of 128° C. and a vapour pressure of 25 Torr at 20° C. allowing gas transfer from a 1.2 L stainless steel ampoule into the reaction chamber at room temperature. Tert-butyl phosphine (TBP) is also a liquid source reactant, and has a boiling point of 54° C. and a vapour pressure of 141 Torr at 10° C. These reactants are therefore more convenient to handle and less hazardous than gaseous silane precursors for chemical vapour deposition for integrated circuit manufacturing.

The DTBS flow rate was varied from 250 to 350 sccm, and for doped films the reactant gas mixture included TBP at flow rates from 130 to 350 sccm to incorporate phosphorus in the deposited silicon carbide layer.

For materials characterization, both undoped and doped films of silicon carbide were deposited on 150 mm p-type 8–15 Ωcm Si (100) wafers and on wafers coated with 300 nm thick silicon dioxide. The films were deposited to thickness of 300 to 370 nm. The films were annealed by rapid thermal annealing in a nitrogen ambient in a rapid thermal reactor to investigate the effect on film crystallinity and resistivity.

The flow rate of argon was varied from 200 to 1000 sccm and was found to have little effect on the stoichiometry of the silicon carbide layer.

Figure 2:
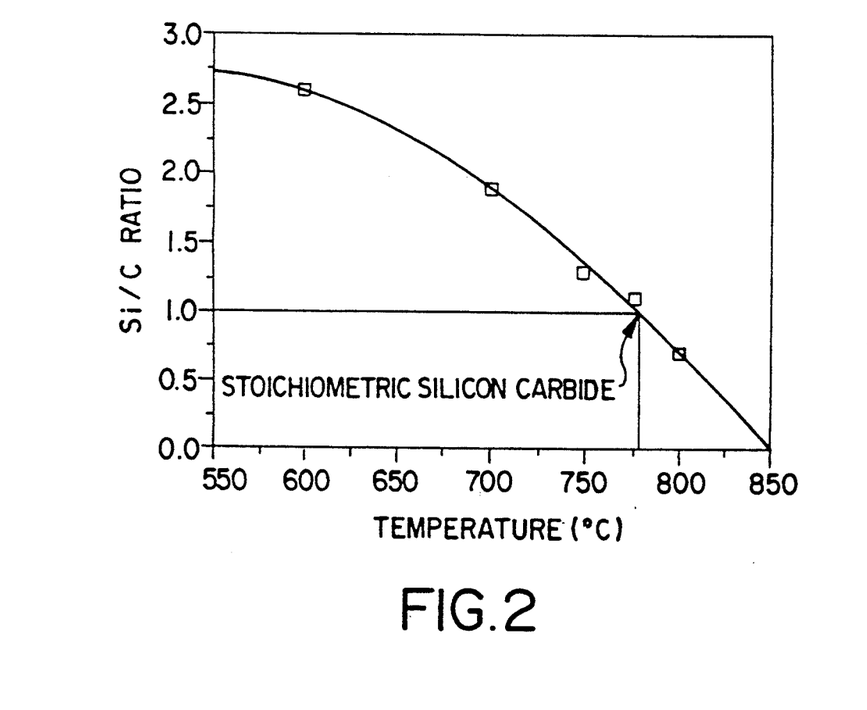
FIG. 2 shows a graph of the silicon to carbon ratio in silicon carbide films grown by the method according to the embodiment of the invention, as a function of the deposition temperature.
Figure 3:
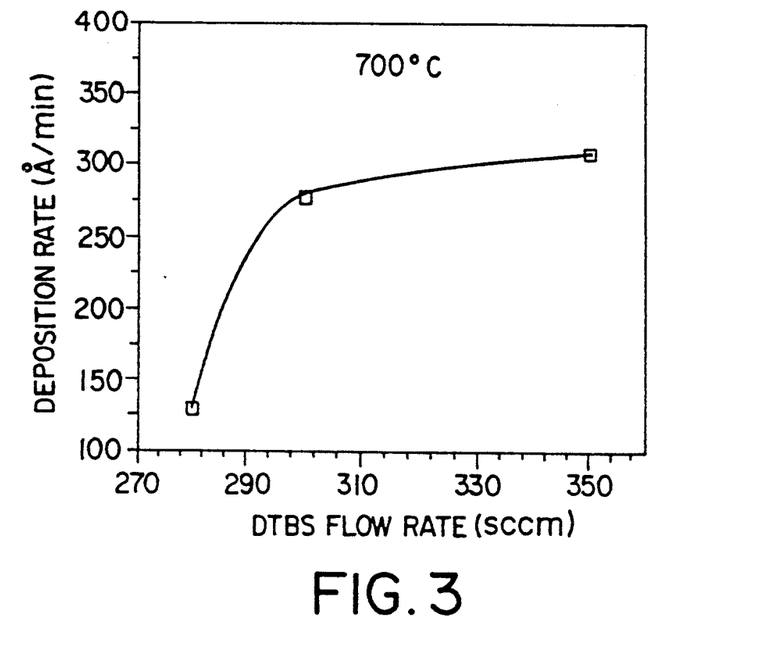
FIG. 3 shows a graph of the deposition rate as a function of DTBS flow rate for the method according to the embodiment.

The film stoichiometry is strongly dependent on the deposition temperature. Analysis by Auger electron spectroscopy found the carbon fraction of the film to increase from 26% for deposition at 550° C. to 57% for deposition at 800° C. Films grown at 775° C. were found to be near stoichiometric and the growth rate was 18 nm/min. At temperatures above 775° C. the deposited film was carbon rich and below 775° C. the deposited film was silicon rich. The stoichiometry was not significantly dependent on other variables (FIG. 2).

Figure 4:
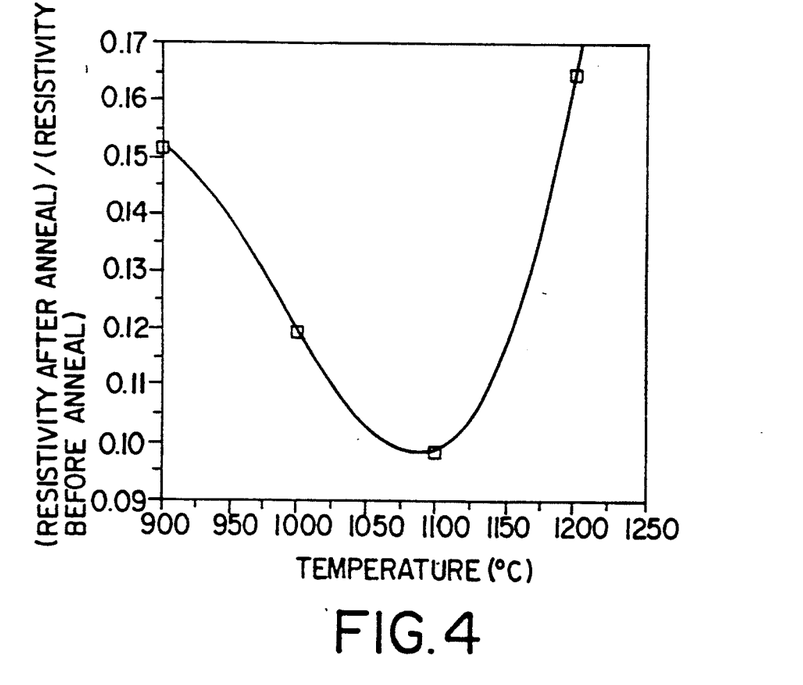
FIG. 4 shows the ratio of the resistivities after and before rapid thermal annealing of doped silicon carbide films as a function of the anneal temperature.

Films deposited below 750° C. were predominantly amorphous. Films grown at 775° C. had a refractive index at 632.8 nm and 830 nm of 2.7, close to the value of 2.64 for monocrystalline SiC reported by P. T. Shaffer and R. G. Naum J. Opt. Soc. Amer, vol 59, no. 1, pp. 1498 (1970) and also J. A. Powell, ibid. vol 62, no. 3. p. 341 (1972). Although the ratio of the resistivity of the film after and before rapid thermal annealing in nitrogen decreased for annealing at temperatures up to 1100° C., the ratio increased at higher anneal temperatures (FIG. 4). This effect was believed to be due to change in the structure of the films on annealing at higher temperature. A film annealed at 1200° C. showed by TEM a polycrystalline grain structure identified by electron diffraction as comprising mainly silicon.

Films deposited from 0.25 to 0.5 Torr adhered well to the substrate while films deposited at ~1 Torr were flaky. The DTBS flow rate appeared to affect the deposition rate only, while the pressure affected the physical quality of the deposited film.

Auger electron spectroscopy showed that the doped SiC film deposited at 775° C. was stoichiometric. TEM showed that the as deposited material was amorphous but became microcrystalline following RTA at temperatures in excess of 1000° C.

High flow rates of TBP were required to obtain measurable conductivity in the SiC films deposited at 775° C., and resistivities of 0.2 Ωcm were obtained with a flow rate of 340 sccm of TBP. After rapid thermal annealing (RTA) the resistivity fell by an order of magnitude. Resistivities as low as 0.02 Ωcm were obtained after RTA of phosphorus doped silicon carbide with a phosphorus concentration of ~$10^{20}$ cm$^{-3}$. Lower resistivities may be obtained by increasing the phosphorus concentration, i.e. up to the maximum solubility limit of ~$10^{21}$ cm$^{-3}$, by increasing the flow rate of TBP during deposition, i.e. in the flow range above 340 sccm to provide the desired phosphorus concentration. For example, it is feasible to increase the flow rate of TBP up to 1000 sccm in the method described above.

It was found that exclusion of residual oxygen in the CVD reaction chamber was critical to formation of high quality silicon carbide films. Preferably argon was purified by a point-of-use system, e.g. a Nanochem purifier, manufactured by Semi-Gas Systems, and flowed through the reaction chamber before and during deposition of silicon carbide.

When Nanochem purified argon was not used for purging the chamber, there was typically 5 to 10% oxygen incorporated in the deposited silicon carbide layer. Oxygen is known to form generation recombination centres that can increase junction leakage; therefore every attempt was made to reduce the oxygen content of the films. Analysis of the films by Auger electron spectroscopy, elastic recoil detection and Fourier transform infrared absorption spectroscopy indicated the absence of a detectable level of oxygen in the bulk of the films (i.e. less than 0.1 atomic %, i.e. $10^{20}$ cm$^{-3}$ [O]) which were deposited in a carrier gas of Nanochem purified argon. The hydrogen content of the films was ~2 to 4%.

The NF$_3$ pre-clean was found to be beneficial in removing the native oxide from the active device area. Furthermore presence of fluorine aids in passivation of dangling bonds in the deposited SiC layer, as for example discussed in T. Sugii, T. Aoyama, Y. Furumura, and T. Ito, Proceedings of the First Topical Symposium on Silicon Based Heterostructures, edited by S. S. Iyer et al., Toronto, Canada October 1990, pp. 124, which results in improved crystallinity after annealing of the amorphous, as deposited, layer of SiC.

NF$_3$ was flowed into the reaction chamber in the presence of argon as an initial pre-clean and surface preparation step only, and then the NF$_3$ flow was stopped, and the reaction chamber was purged with argon before the mixture of reactant gases, i.e. TBP and DTBS, was introduced into the reaction chamber for deposition of silicon carbide (Example I).

Use of NF$_3$ during deposition is hazardous since it is a strong oxidizing agent and reacts violently with hydrocarbons and their derivatives. In the method of deposition of silicon carbide described above, the surface is passivated by fluorine species remaining on the surface after exposure to NF$_3$, but direct reaction of gas phase NF$_3$ with TBP and DTBS is avoided. Although NF$_3$ may be used prior to deposition of the silicon carbide layer for the purpose of incorporating fluorine in to the silicon carbide layer, alternative sources of fluorine may be preferred for use in the reactant mixture during deposition of the silicon carbide layer.

Alternatively, reactive fluorine species may be generated for the pre-clean and surface preparation step by plasma excitation of other fluorine sources.

In a method of depositing silicon carbide according to a second embodiment of the present invention, silicon heterojunction diodes were formed in a similar manner as in the first embodiment, except that, after an initial step of preparing the substrate by pre-cleaning and passivating the substrate surface (i.e. step (i) of Example II) by exposure to nitrogen trifluoride, as described above (Example I), deposition of the desired thickness of silicon carbide to form an emitter structure was carried out in 2 or more steps as follows, each silicon carbide deposition step being followed by a surface preparation step with exposure of the silicon carbide surface to NF$_3$ to incorporate fluorine into the silicon carbide layer. Thus, to deposit a 100 nm thick layer of silicon carbide, a first thickness of 18 nm to 54 nm of a layer of n+ doped silicon carbide under the conditions shown in the table of Example II step (ii), i.e. during a 1 to 3 minute deposition step at a deposition rate of 18nm per minute, to provide a predetermined thickness of silicon carbide, as required. Then the flow of reactant gases DTBS and TBP were stopped and after purging the chamber with the inert carrier gas, i.e. argon, NF$_3$ was again introduced into the reaction chamber and the deposited silicon carbide surface was exposed to NF$_3$ for 1 minute, Example II, step (iii). During this time fluorine species adsorb on the surface and passivate the silicon carbide surface. After purging the chamber with argon, a second thickness of silicon carbide was provided, step (iv), in a second silicon carbide deposition step similar to the first, i.e. during a 1 minute deposition cycle as noted above (Example II) to provide an additional 18 nm of silicon carbide. Subsequently, another 1 minute NF$_3$ passivation step as in step (iii) followed by a further 1 minute silicon carbide deposition step as in step (iv) were performed. The latter process steps (iii) and (iv) were repeated from 1 to 3 times, until a desired thickness of, for example, 100 nm silicon carbide layer was deposited. Thus fluorine was incorporated into the deposited silicon carbide layer in a sandwich fashion.

After annealing by rapid thermal processing at 1050° C. for a time sufficient to form a crystalline phase of silicon carbide, for example, 30 seconds, subsequent processing steps, including contact formation were carried out as described in the first embodiment, to provide contacts to the silicon heterojunction diode by a conventional method.

By purging of the CVD reaction chamber with the carrier gas, i.e. purified argon, between each of the NF$_3$ passivation steps and each silicon carbide deposition steps, NF$_3$ may be used to passivate the silicon surface, while gas phase reactions between the NF$_3$ and the reactant gases, DTBS and TBP, are avoided. During subsequent heat treatment, for example, rapid thermal annealing of the silicon carbide layer to form a crystalline phase of silicon carbide, at temperatures typically in the range 1050° C. to 1100° C. for times of 10 to 120 seconds, fluorine is incorporated into and passivates dangling bonds in the silicon carbide layer.

Current voltage characteristics of the resulting SiC emitter diodes were evaluated. The forward characteristic was nearly ideal (n ~ 1.01) over six decades of current. Resistive voltage drops associated with the lightly doped substrate were apparent at current densities greater than ~10 Acm$^{-2}$. Leakage was approximately 10 nAcm$^{-2}$ at low reverse bias. No forward voltage drop at low current was measured. This characteristic compared with a forward voltage drop of about 0.2 V for a SiC emitter diode formed without $NF_3$ preclean and without fluorine incorporation into the SiC layer.

High injection efficiency of the SiC emitter was confirmed by measurements on lateral bipolar transistors comprising a 10 μm wide, 400 μm long emitter stripes comprising silicon carbide formed as described above, and paralleled on each side at a separation of 20 μm by a collector stripe. Although low current gains, slightly greater than one, were obtained in these lateral transistors, the low gain is believed to be the result of poor collection efficiency in the lateral transistor. Good ohmic contacts to the emitter were formed when a TiW contact layer was deposited directly over the silicon carbide layer.

For commercial applications in fabrication of integrated circuits, safety issues are an important consideration and ease of handling of volatile liquid source reagents compared to the gaseous source reagents is a significant advantage. DTBS is a preferred liquid source reagent for CVD of silicon carbide, because it is non toxic and air stable. It is a single reagent source of both silicon and carbon. Furthermore, the use of DTBS is believed to result in a surface controlled reaction, with the tert-butyl group being known as a good leaving group. In variations of the methods according to the embodiments, alternative known liquid source organosilicon compounds are used instead of DTBS, for example, di-ethyl silane $(C_2H_5)_2SiH_2$ or other volatile liquid silane derivatives, or derivatives of DTBS. Those reagents capable of reacting to provide silicon carbide at temperatures below 800° C. are preferred for processes for silicon integrated circuit fabrication. Dopant impurities, e.g. phosphorus, are incorporated from suitable known source reagents, with volatile liquid source organic reagents such as TBP, being preferred over gaseous reagents such as phosphine for safety reasons, as noted above.

Thus a CVD method is provided for forming emitter quality, poly-crystalline silicon carbide with a lower thermal budget and improved control of impurities over other known methods of forming silicon carbide for application to BiCMOS processing for Si HBTs.

In use of $NF_3$ for incorporation of fluorine in silicon carbide as described in the embodiments, the chamber is purged with inert gas between each step of passivating the surface of the deposited silicon carbide and the subsequent silicon carbide deposition step and thus the stepwise reaction scheme for passivation of silicon carbide with fluorine from $NF_3$ may be used also for deposition of silicon carbide from a mixture comprising reactant gases or vapours, e.g. hydrocarbons, which preferably, for safety or other reasons, would not be mixed directly with $NF_3$ or other reactive fluorine sources. Thus the $NF_3$ pre-clean and passivation steps described above may alternatively be used in conjunction with deposition of silicon carbide by other known methods and from reactant gases, other than from the volatile liquid sources mentioned above. For example, known methods of forming silicon carbide include deposition from a reactant mixture comprising silane and trichloroethane (TCA) or from a mixture comprising acetylene and dichlorosilane as described in the reference to T. Sugii et al. cited above.

What is claimed is:

1. A method of forming silicon carbide for an integrated circuit structure comprising:
    exposing a surface of a substrate in a chemical vapour deposition chamber and purging the chamber to remove residual oxygen by flowing through the chamber an inert gas purified to remove oxygen;
    pre-cleaning and passivating the surface of the substrate with fluorine by exposure to a reactive fluorine containing gas;
    purging the chamber with inert gas;
    then exposing the substrate to a gaseous reactant mixture comprising di-tert-butyl silane and said inert gas and at a controlled flow rate, pressure and at a deposition temperature in the range 550° to 800° C., thereby depositing a layer of silicon carbide on the substrate,
    and subsequently annealing the deposited silicon carbide in an inert atmosphere at a temperature above the deposition temperature and below 1100° C. whereby fluorine is incorporated into and passivates the deposited silicon carbide.

2. A method of forming a conductive layer of silicon carbide for an integrated circuit structure, comprising:
    exposing a substrate of an integrated circuit within a reaction chamber to a mixture of reactant gases comprising di tert-butyl silane at a flow rate of 250 to 350 sccm and tert-butyl phosphine at a flow rate of 130 to 350 sccm in an inert gas at a flow rate from 200 to 1000 sccm, while maintaining the pressure in the range from 0.25 to 1 Torr and the deposition temperature in the range from 550° to 800°

| EXAMPLE I | | |
|---|---|---|
| | Pre-Clean | SiC deposition |
| Gas flow [(SCCM)] | | |
| Ar (SCCM) | 1000 | 500 |
| NF (SCCM) | 500 | 0 |
| DTBS (SCCM) | 0 | 250 |
| TBP (SCCM) | 0 | 340 |
| Pressure (Torr) | 0.35 | 0.35 |
| Deposition, Temperature (°C.) | 775[° C.] | 775[° C.] |

| EXAMPLE II | | | | |
|---|---|---|---|---|
| | Step (i) Pre-Clean | Step (ii) SiC Deposition | Step (iii) Passivation | (Step iv) SiC Deposition |
| Gas flow [(SCCM)] | | | | |
| Ar (SCCM) | 1000 | 500 | 1000 | 500 |
| $NF^3$ (SCCM) | 500 | 0 | 500 | 0 |
| DTBS (SCCM) | 0 | 250 | 0 | 250 |
| TBP (SCCM) | 0 | 340 | 0 | 340 |
| Pressure (Torr) | 0.35 | 0.35 | 0.35 | 0.35 |
| Deposition, Temperature (°C.) | 755[° C.] | 775[° C.] | 775[° C.] | 775[° C.] |
| Time (min) | 1 [min] | 1-3 [min] | 1 [min] | 1 [min] |

C., thereby depositing a layer of n-doped amorphous silicon carbide on the substrate, and annealing the amorphous silicon carbide layer at a temperature above the deposition temperature and below 1100° C. for a time sufficient to form a polycrystalline phase of n-doped silicon carbide.

3. A method according to claim 2 wherein the inert gas is purified to remove oxygen, and the reaction chamber is purged after evacuation of the chamber by flowing said purified inert gas through the chamber immediately before exposing the substrate to the mixture of reactant gases, whereby a layer of silicon carbide is deposited having an oxygen content of less than 0.1 atomic percent.

4. A method according to claim 2 wherein the deposition temperature is maintained about 775° C.

5. A method according to claim 4 comprising annealing the amorphous silicon carbide layer by rapid thermal processing in an inert atmosphere at a temperature in the range 1000° C. to 1100° C. for 1 to 100 seconds.

6. A method of providing a silicon carbide emitter structure for a silicon heterojunction bipolar transistor comprising the steps of:

providing a substrate for an integrated circuit comprising a surface dielectric layer having defined therein an emitter opening, the emitter opening defining an active device region of the substrate including a heavily doped base region;

exposing the substrate within a reaction chamber;

purging the chamber with an inert carrier gas to remove residual oxygen;

and then exposing the substrate to a mixture of reactant gases comprising di-tert-butyl silane at a flow rate of 250 to 350 sccm and tert-butyl phosphine at a flow rate of 130 to 350 sccm in an oxygen free inert carrier gas, at a flow rate from 200 to 1000 sccm, while maintaining the pressure in the range from 0.25 to 1 Torr and the temperature in the range from 550° to 800° C., whereby a layer of n+ doped amorphous silicon carbide is deposited on the substrate, said layer of silicon carbide comprising less than 0.1 atomic percent oxygen, and subsequently annealing the silicon carbide layer in an inert atmosphere at a temperature greater than the deposition temperature and less than 1100° C. and for a time sufficient to form a polycrystalline phase of n+ doped silicon carbide.

7. A method according to claim 6 wherein the subsequent step of annealing the silicon carbide layer comprises rapid thermal processing in nitrogen at a temperature in the range from 1000° C. to 1100° C. and for a time in the order of 1 to 100 seconds.

8. A method according to claim 6 wherein after purging the chamber to remove residual oxygen and before the step of exposing the substrate to the mixture of reactant gases, the method comprises an initial step of introducing a reactive fluorine containing gas into the CVD chamber together with said inert carrier gas for passivating the substrate surface with fluorine, and then purging the chamber with inert gas.

9. A method according to claim 8 wherein said reactive fluorine containing gas comprises nitrogen trifluoride.

10. A method of forming polycrystalline silicon carbide for an integrated circuit structure comprising:

exposing a substrate in a chemical vapour deposition chamber and purging the chamber with an inert gas to remove residual oxygen;

exposing the substrate to a gaseous reactant mixture comprising di-tert-butyl silane and an oxygen free inert gas, at a controlled flow rate and pressure and at a deposition temperature in the range 550° C. to 800° C., thereby depositing a layer of amorphous silicon carbide on the substrate; and annealing the deposited amorphous silicon carbide layer in an inert atmosphere at a temperature above the deposition temperature and below 1100° C. for a time sufficient to form polycrystalline silicon carbide.

11. A method according to claim 10 wherein deposition of silicon carbide is carried out at a temperature of 775° C. and annealing comprises rapid thermal processing in an inert atmosphere at a temperature of between 1000° C. and 1100° C. for a time in the order of 10 to 100 seconds.

12. A method of forming silicon carbide for an integrated circuit, comprising:

exposing a substrate in a chemical vapour deposition chamber and purging the chamber to remove residual oxygen;

exposing the substrate to a gaseous reactant mixture comprising di-tert-butyl silane, a source of a dopant species, and an oxygen free inert gas, at a deposition temperature in the range 550° C. to 800° C., and controlling the flow rates and pressure, thereby depositing a layer of silicon carbide on the substrate, the deposited silicon carbide incorporating said dopant species and having an oxygen content of less than 0.1 atomic percent.

13. A method according to claim 10 wherein the source of dopant species comprises tert-butyl phosphine whereby a phosphorus doped silicon carbide layer is deposited on the substrate.

14. A method according to claim 12 wherein the source of dopant species is derived from a volatile liquid source selected from the group of organo-phosphorus and organo-boron compounds.

15. A method according to claim 12 wherein the pressure is maintained in the range from about 0.25 Torr to 1 Torr.

16. A method according to claim 12 wherein the flow rate of inert gas is in the range 200 to 1000 sccm and the flow rate of di-tert-butyl silane is in the range 250 to 350 sccm.

17. A method according to claim 12 comprising a subsequent step of annealing the silicon carbide layer in an inert atmosphere at a temperature greater than the deposition temperature and less than 1100° C. for a time sufficient to form a polycrystalline phase of doped silicon carbide.

18. A method according to claim 12 comprising a subsequent step of annealing the silicon carbide layer in an inert atmosphere at a temperature greater than the deposition temperature and less than 1100° C. and for a time sufficient to form a crystalline phase of silicon carbide.

19. A method according to claim 12 or claim 2 comprising an initial step of pre-cleaning and passivating the substrate with fluorine by exposure to a reactive fluorine-containing gas.

20. A method according to claim 12 or claim 2 comprising an initial step of preparing the substrate by exposure to nitrogen trifluoride in an inert carrier gas thereby passivating the substrate with fluorine, and then purging the chamber with inert gas before introducing the reactant gas mixture into the chamber for deposition of silicon carbide.

21. A method according to claim 13 wherein the flow rate of inert gas in the range 200 to 1000 sccm, the flow rate of di-tert-butyl silane is in the range 250–300 sccm, and the flow rate of tert-butyl phosphine is in the range 130 to 350 sccm.

22. A method according to claim 21 comprising annealing the deposited silicon carbide layer in an inert atmosphere at a temperature above the deposition temperature and below 1100° C. for a sufficient time to form a conductive layer of phosphorus doped polycrystalline silicon carbide.

23. A method according to claim 22 wherein deposition of silicon carbide is carried out at a temperature of 775° C. and annealing comprises rapid thermal processing in an inert atmosphere at a temperature of between 1000° C. and 1100° C. for a time in the order of 10 to 100 seconds.

24. A method according to claim 12 wherein the stoichiometry of the deposited silicon carbide film has a dependence on the deposition temperature, and the method comprises selecting the deposition temperature to provide a layer of silicon carbide having a specific ratio of silicon and carbon.

25. A method of forming layer of polycrystalline silicon carbide for an integrated circuit structure comprising:
 exposing a surface of an integrated circuit substrate in a chemical vapour deposition chamber, purging the chamber to remove residual oxygen by flowing through the chamber an inert gas purified to remove oxygen, and then exposing the substrate to a gaseous reactant mixture comprising di-tert-butyl silane, a source of a doping species, and an oxygen free inert gas, at a deposition temperature in the range 550° C. and 800° C., and controlling the pressure and flow rates, thereby depositing a layer of doped amorphous silicon carbide on the substrate; and,
 annealing the amorphous silicon carbide layer in an inert atmosphere at a temperature above the deposition temperature and below 1100° C. for a time sufficient to form a conductive layer of doped polycrystalline silicon carbide.

26. A method of forming silicon carbide for an integrated circuit structure comprising:
 exposing a surface of a substrate of an integrated circuit in a chemical vapour deposition chamber, and after purging the chamber with inert gas, sequentially performing the steps of:
 a) precleaning and passivating the substrate surface by exposure to a reactive fluorine species;
 b) purging the chamber with an inert gas;
 c) depositing silicon carbide by pyrolysis a reactant gas mixture comprising a source of silicon and carbon, and an inert gas;
 d) purging the chamber with an inert gas;
 e) exposing the deposited silicon carbide to the reactive fluorine species thereby passivating exposed surfaces of silicon carbide with fluorine; and,
 repeating steps b) to e) until a layer of a desired thickness of silicon carbide has been deposited; and, subsequently annealing the layer of silicon carbide, thereby incorporating fluorine therein.

27. A method according to claim 26 wherein the deposition temperature is maintained in the range 550° C. to 800° C.

28. A method according to claim 26 wherein the reactive fluorine containing gas comprises nitrogen trifluoride.

29. A method according to claim 26 wherein the reactant gas mixture includes a source of a dopant species.

30. A method according to claim 29 wherein the reactant gas mixture comprises a single source precursor of silicon and carbon and a source of a doping species, each being derived from volatile liquid source precursors.

31. A method according to claim 30 wherein the source of silicon and carbon is provided by di-tert-butyl silane and the source of dopant is provided by tert-butyl phosphine.

32. A method according to claim 26 wherein the inert gas is purified to exclude oxygen, and comprising an initial step of purging the chamber with inert gas and maintaining an oxygen free ambient, whereby the deposited layer of silicon carbide incorporates less than 0.1 atomic percent of oxygen.

33. A method of forming silicon carbide for an integrated circuit, comprising:
 exposing a surface of a substrate of an integrated circuit in a chemical vapour deposition chamber, and after purging the chamber with inert gas, sequentially performing the steps of:
 a) pre-cleaning and preparing the substrate surface by exposure to a reactive fluorine containing gas;
 b) purging the chamber with an inert gas;
 c) providing a layer of doped silicon carbide on the substrate surface by a method of chemical vapour deposition from a mixture of reactant gases comprising a source of silicon and carbon derived from a volatile liquid phase precursor and a source of a dopant species, and an inert gas;
 d) purging the chamber with the inert gas to remove the reactant gases;
 e) exposing the deposited silicon carbide to said reactive fluorine containing gas thereby passivating exposed surfaces of silicon carbide with fluorine; and
 then sequentially repeating the steps b) to e) until a desired thickness of silicon carbide has been deposited, thereby incorporating fluorine into the silicon carbide.

34. A method according to claim 33 comprising a subsequent step of annealing the silicon carbide layer at a temperature greater than the deposition temperature, and less than 1100° C. for a time sufficient to form a conductive layer of doped silicon carbide, whereby fluorine is incorporated into and passivates the doped silicon carbide.

35. A method according to claim 33 wherein the inert gas is purified to remove oxygen, and the method comprises an initial step of purging the chamber with the inert gas to remove residual oxygen, and maintaining an oxygen free ambient, whereby the deposited layer of silicon carbide contains less than 0.1 atomic percent of oxygen.

36. A method according to claim 33 wherein, in the step of depositing silicon carbide, the source of silicon and carbon comprises di-tert-butyl silane, said reactant gases and the inert gas being introduced into the chamber at controlled flow rates and pressure and at a deposition temperature between 550° C. and 800° C.

37. A method according to claim 36 comprising, after depositing the desired thickness of silicon carbide, performing a subsequent step of annealing the silicon carbide layer by heating in an inert atmosphere at a temperature greater than the deposition temperature and less than 1100° C. for a time sufficient to form polycrystalline doped silicon carbide, whereby fluorine is incorporated into and passivates the doped silicon carbide.

* * * * *